(12) United States Patent
Parris et al.

(10) Patent No.: US 6,597,201 B1
(45) Date of Patent: Jul. 22, 2003

(54) DYNAMIC PREDECODER CIRCUITRY FOR MEMORY CIRCUITS

(75) Inventors: Michael C. Parris, Colorado Springs, CO (US); Kim Carver Hardee, Colorado Springs, CO (US)

(73) Assignee: Mosel Vitelic, Inc., Wsinchu (TW)

( * ) Notice: Subject to any disclaimer, the term of this patent is extended or adjusted under 35 U.S.C. 154(b) by 0 days.

(21) Appl. No.: 09/650,494

(22) Filed: Aug. 29, 2000

Related U.S. Application Data
(60) Provisional application No. 60/185,301, filed on Feb. 28, 2000.

(51) Int. Cl.[7] .......................................... H03K 19/0185
(52) U.S. Cl. ........................... 326/93; 326/95; 326/108; 326/105; 327/208; 365/203; 365/230.06
(58) Field of Search ............................. 326/93, 95, 98; 327/208–212, 214, 215, 218, 224, 225, 108; 365/203, 203.06

(56) References Cited

U.S. PATENT DOCUMENTS

| | | | | |
|---|---|---|---|---|
| 5,668,485 A | * | 9/1997 | Rountree | 326/108 |
| 5,764,089 A | * | 6/1998 | Partovi et al. | 327/200 |
| 5,796,270 A | * | 8/1998 | Fifield et al. | 326/86 |
| 5,828,234 A | * | 10/1998 | Sprague | 326/98 |
| 5,942,917 A | * | 8/1999 | Chappell et al. | 326/121 |
| 6,028,814 A | * | 2/2000 | Lim | 365/230.06 |
| 6,111,444 A | * | 8/2000 | Mikan, Jr. et al. | 327/211 |
| 6,118,324 A | * | 9/2000 | Li et al. | 327/384 |

* cited by examiner

*Primary Examiner*—Michael Tokar
*Assistant Examiner*—Vibol Tan
(74) *Attorney, Agent, or Firm*—Cook, Alex, McFarron, Manzo, Cummings & Mehler, Ltd.

(57) ABSTRACT

A predecoder circuit for use in association with a memory circuit is shown to have a dynamic NAND gate formed by series-coupled transistors controlled by a bank active select signal and a row address selection signal. The predecoder circuit also includes a precharge circuit coupled to the dynamic NAND gate and controlled by a precharge signal. The predecoder circuit further includes a first inverter having an input terminal electrically coupled to the dynamic NAND gate and an output terminal selectively electrically connectable to at least one row decoder circuit for the memory circuit. The predecoder circuit finally includes a second inverter arranged in feedback with the first inverter to form a latch.

6 Claims, 7 Drawing Sheets

DYNAMIC PREDECODER CIRCUITRY FOR MEMORY CIRCUITS

CROSS-REFERENCE TO RELATED APPLICATION

This application relates to and claims the benefit of priority of U.S. Provisional Application No. 60/185,301, filed Feb. 28, 2000, the full disclosure of which is hereby incorporated herein by reference.

BACKGROUND OF THE INVENTION

The present invention relates to dynamic predecoder circuitry and particularly to dynamic predecoder circuitry for use in array decoding for integrated circuit memory chips.

Decoding circuitry is common in memory circuits to enable a particular row and/or a particular column for reading and/or writing. To eliminate the amount of circuitry required to perform the decoding functions, which translates into less silicon area being used, decoding circuitry often includes predecoder circuitry. Although useful for certain, limited applications, conventional predecoder circuits typically have several drawbacks.

A first common drawback of conventional predecoder circuits is that they are relatively slow. In particular, conventional predecoder circuits use static logic gates, typically full CMOS gates, which are relatively slow. As will be appreciated by those skilled in the art, speed is always a factor in memory circuit design. Slower predecoder circuitry translates into slower memory circuit performance.

A second common drawback of conventional predecoder circuits is that they require a relatively large chip area. In particular, conventional predecoder circuits use full CMOS logic gates, which requires additional chip area. As will be appreciated by those skilled in the art, decreasing the chip area required for circuits included within a memory circuit translates into increased performance and reduction in costs associated with memory circuits.

A third common drawback of conventional predecoder circuits is that they consume a relatively large amount of power. This is particularly due to use of full CMOS gates in conventional predecoder circuits. As will be appreciated by those skilled in the art, generally speaking, the less power consumed by a memory circuit, the better.

A fourth common drawback of conventional predecoder circuits is that they require separate address busses for each memory bank. This requires a relatively large amount of chip area, which translates into increased chip size for the memory circuit.

Two conventional predecoder circuits will now be briefly described. Referring to FIG. 1, illustrated therein is a conventional row predecoder circuit 10 and a conventional row decoder circuit 12, both of which are typically used in the prior art. As shown and as will be appreciated by those skilled in the art, row predecoder circuit 10 includes several devices that are not used in the embodiments of the row predecoder circuits of the present invention shown in FIGS. 3 and 5, respectively. Further, the row predecoder circuit 10 of FIG. 1 does not permit sharing of the row address bus. Accordingly, separate address busses must be used for each memory bank. The additional devices and the additional address busses inherently increase the memory circuit chip size, which is a drawback.

FIG. 2 illustrates another conventional row predecoder circuit 20 and the conventional row decoder circuit 12 shown in FIG. 1. Row predecoder circuit 20 includes a full CMOS NAND gate 22 and an inverter 24. As shown and as will be appreciated by those skilled in the art, by incorporating full CMOS NAND gate 22, row predecoder circuit 20 uses static logic, as opposed to dynamic logic. Predecoder circuit 20 is relatively slow in comparison to the embodiments of the present invention shown in FIGS. 3 and 5, respectively. The full CMOS logic gate takes up a larger silicon area than the CMOS gates shown in FIGS. 3 and 5. The full CMOS logic technology also consumes higher power due to increased loading and the consequent through current during gate switching.

In light of the foregoing, it is an object of the preferred forms of the present invention to provide for a relatively fast predecoder circuit.

It is another object of the preferred forms of the present invention to provide for a predecoder circuit that requires a relatively small amount of chip area.

It is still another object of the preferred forms of the present invention to provide for a predecoder circuit that consumes a relatively small amount of power.

It is yet another object of the preferred forms of the present invention to provide for a predecoder circuit that allows for a shared address bus for multiple memory cell banks in a memory circuit.

It is still yet another object of the preferred forms of the present invention to provide for a predecoder circuit that uses dynamic gates to provide for faster speed and little or no through current during switching.

These and other objects of the preferred forms of the invention will become apparent from the following description. It will be understood, however, that an apparatus could still appropriate the invention claimed herein without accomplishing each and every one of these objects, including those gleaned from the following description. The appended claims, not the objects, define the subject matter of this invention. Any and all objects are derived from the preferred forms of the invention, not necessarily the invention in general.

Throughout this specification, reference will be made to inputs, outputs, lines and busses that are included within the preferred form of the dynamic predecoder circuitry. Throughout this specification, if reference is made to one of these, such as a line, and that line is given a particular reference numeral for identification purposes, then another data line given the same reference numeral but with a "B" designation shall be understood to be its complement. For instance, a line 300B would be understood to be the complement of line 300. Conversely, line 300 would be the complement of line 300B. Generally speaking, if they are not tied together (such as when they are equalized), or if they are not driven to the same logic state for a special purpose, when line 300 is HIGH, line 300B is LOW. Conversely, absent special conditions, when line 300 is LOW, line 300B is HIGH. Those skilled in the art will appreciate this concept and understand this designation hereby incorporated herein by reference.

SUMMARY OF THE INVENTION

In a preferred form, the present invention is directed to a predecoder circuit for use in association with a memory circuit. The predecoder circuit includes a dynamic NAND gate comprising first and second NMOS transistor devices coupled in series. The first NMOS transistor device has a control electrode to which a bank active select signal is applied. The second NMOS transistor device has a control electrode to which a row address selection signal is applied. The predecoder circuit further includes a precharge circuit coupled to one of the first and second NMOS transistor devices defining a junction between the precharge circuit and the one of the first and second NMOS transistors. The precharge circuit includes a PMOS transistor device having a control electrode to which a precharge signal is applied. The predecoder circuit also includes a first inverter having an input terminal electrically coupled to the dynamic NAND gate and the precharge circuit at the junction and an output terminal selectively electrically connectable to at least one row decoder circuit for said memory circuit. The predecoder circuit further includes a second inverter having an input terminal electrically coupled to the output terminal of the first inverter and an output terminal electrically coupled to the input of the first inverter.

In another preferred form, the present invention is again directed to a predecoder circuit for use in association with a memory circuit. In this preferred form, the predecoder circuit includes a dynamic NAND gate comprising first and second NMOS transistor devices coupled in series. The first NMOS transistor device has a control electrode to which a bank active select signal is applied. The second NMOS transistor device has a control electrode to which a row address selection signal is applied. The predecoder circuit also includes a precharge circuit coupled to one of the first and second NMOS transistor devices defining a junction between the precharge circuit and the one of said first and second NMOS transistors. The precharge circuit includes a PMOS transistor device having a control electrode to which the bank active select signal is applied. The predecoder circuit further includes an inverter having an input terminal electrically coupled to the dynamic NAND gate and the precharge circuit at the junction and an output terminal selectively electrically connectable to at least one row decoder circuit for the memory circuit.

BRIEF DESCRIPTION OF THE DRAWINGS

In describing the prior art and the present invention, reference has been and will be made to the accompanying drawings wherein like parts have like reference numerals, and wherein.

DETAILED DESCRIPTION OF THE PREFERRED EMBODIMENTS

Figure 1:
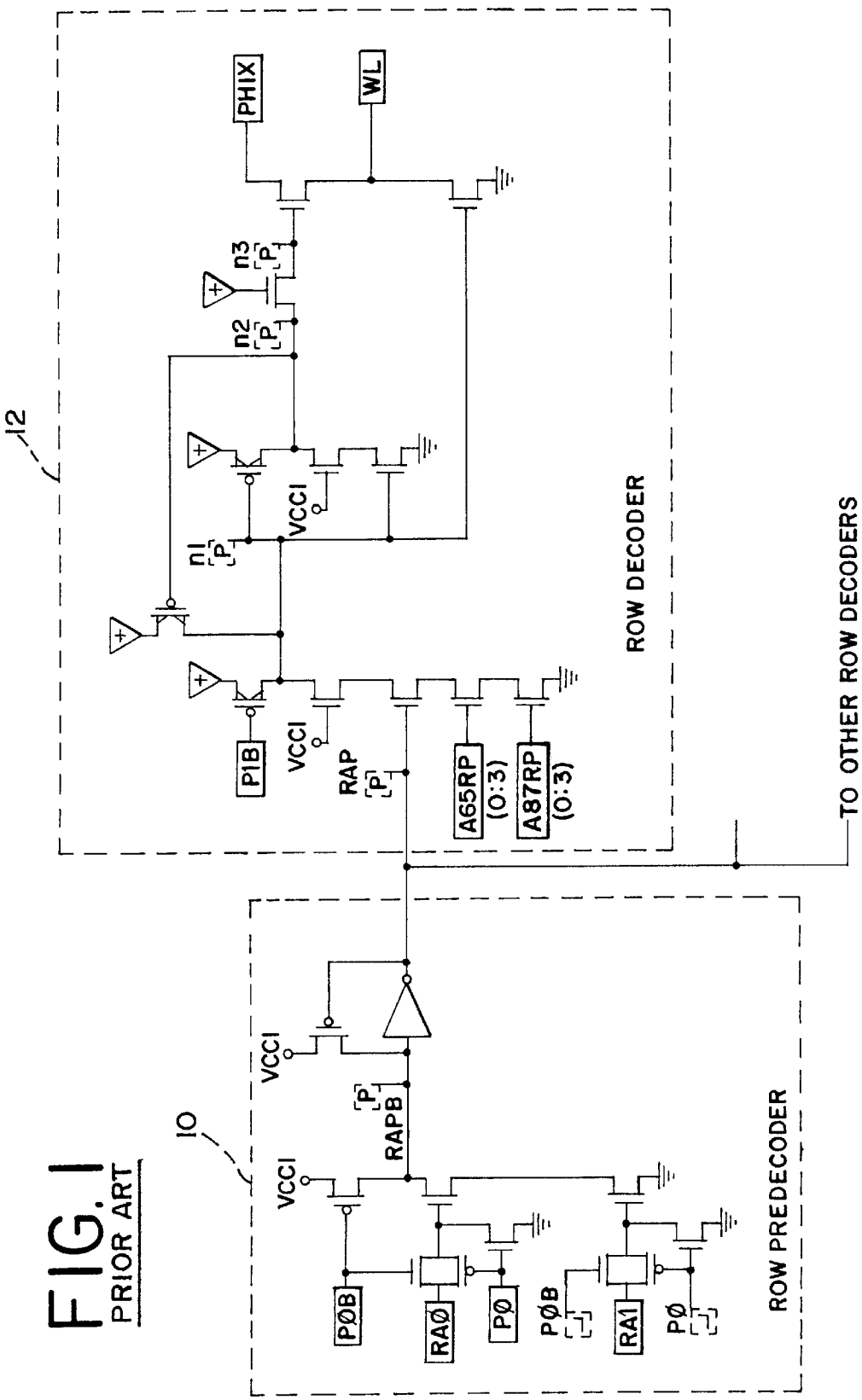
FIG. 1 is a circuit schematic diagram of prior art row predecoder and row decoder circuits of the type conventionally used in memory circuits.
Figure 3:
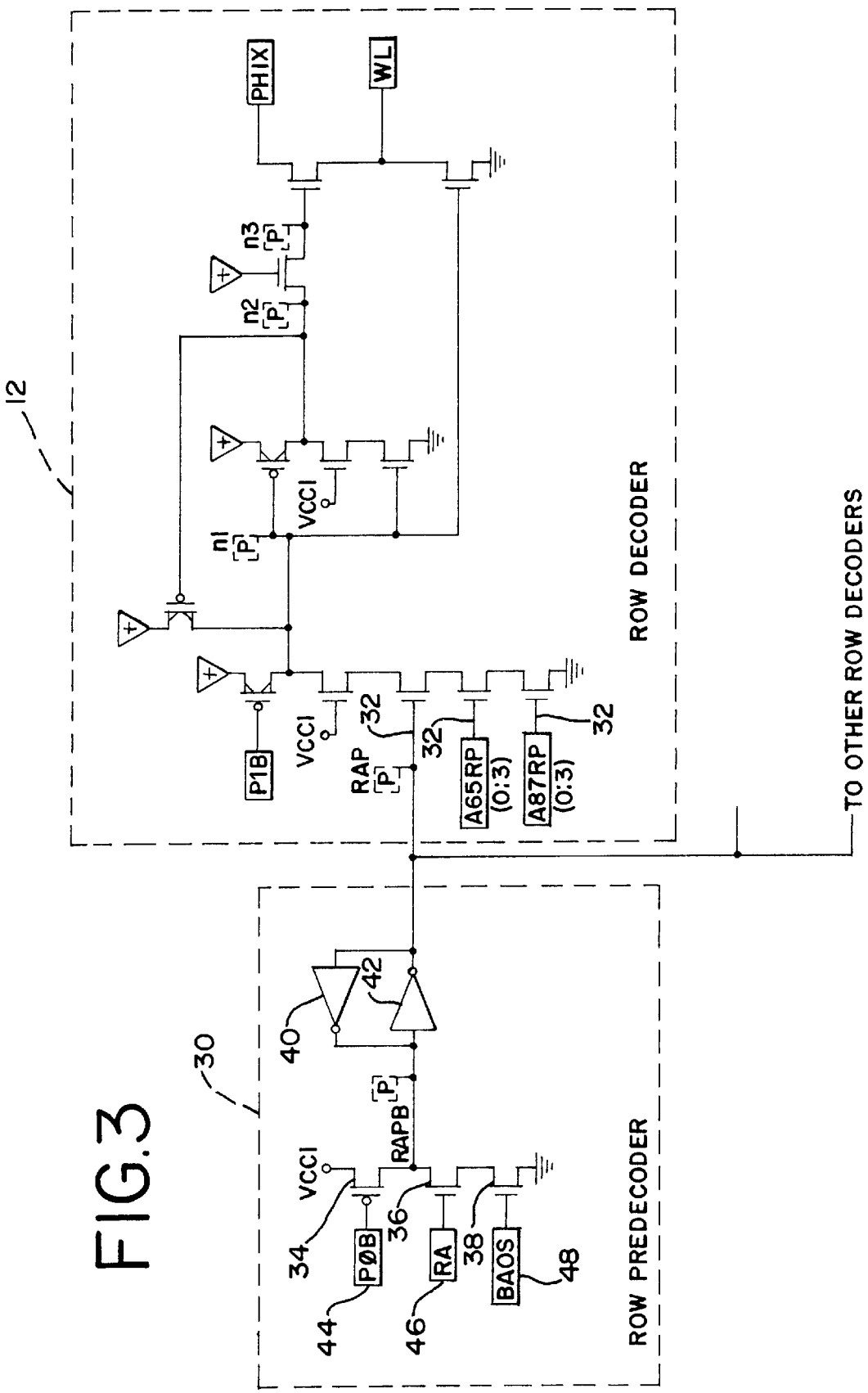
FIG. 3 is a circuit schematic diagram of a first embodiment of a row predecoder circuit constructed in accordance with the principles of the present invention and a row decoder circuit.

FIG. 3 illustrates a row predecoder circuit 30 and the conventional row decoder circuit 12 shown in FIG. 1. As shown, row predecoder circuit 30 is connected to row decoder circuit 12 and typically is connected to other row decoder circuits (not shown). As will be appreciated, additional row predecoder circuits (not shown) might be connected to row decoder circuit 12, specifically by enable lines 32 connected to the control electrodes for transistors included within the row decoder circuit 12.

Row predecoder circuit 30 includes three transistors 34, 36, 38, and two inverters 40, 42. For transistor 34, which is shown illustratively as a PMOS transistor device, one terminal is connected to Vcc, its control (gate) electrode is connected to a precharge clock line (P0B) 44, which carries a precharge clock signal, and another terminal is connected to the drain terminal of transistor 36, the input terminal of inverter 42 and the output terminal of inverter 40.

For transistor 36, which is shown illustratively as an NMOS transistor device, its drain terminal is connected to a terminal of transistor 34, the input terminal of inverter 42 and the output terminal of inverter 40. The gate electrode of transistor 36 is connected to a row address line (RA) 46, which carries a row address selection signal. The source terminal of transistor 36 is connected to the drain terminal of transistor 38.

For transistor 38, which is shown illustratively as an NMOS transistor device, its drain terminal is connected to the source terminal of transistor 36, its gate electrode is connected to terminal is connected to Vss (e.g., ground).

Figure 7:
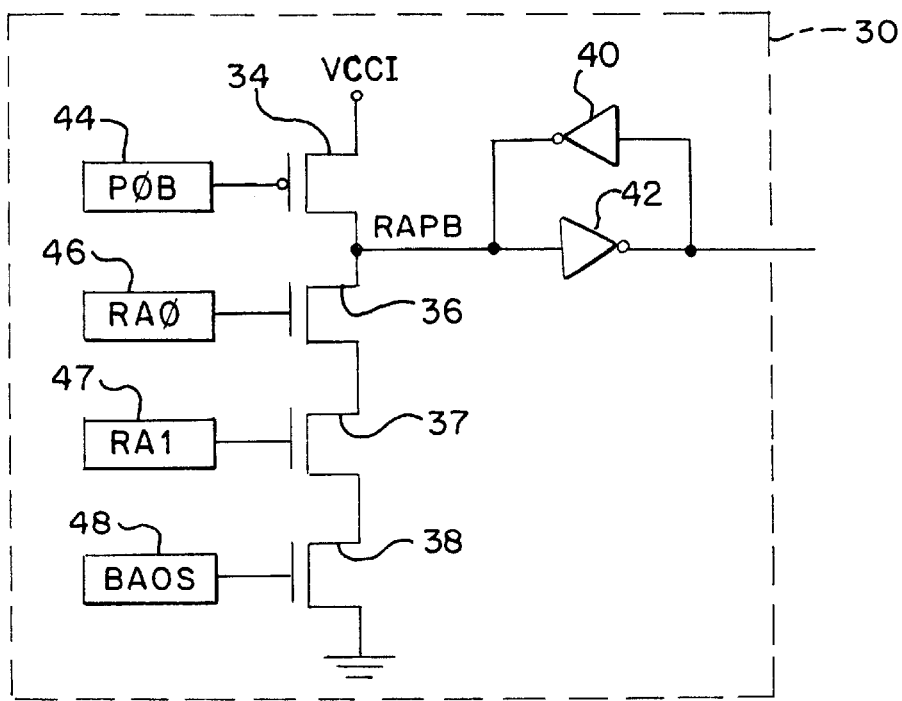
FIG. 7 is a circuit schematic diagram of an alternative embodiment of the predecoder circuitry shown in FIG. 3.

FIG. 7 illustrates the row predecoder circuit 30, but with multiple address inputs. Two address inputs are shown for illustrative purposes. For illustrative purposes, row address line 46 is identified as RA0 in the multiple address input embodiment shown in FIG. 7. As shown, an additional transistor 37 is included, shown illustratively as an NMOS transistor device. The gate electrode of transistor 37 is connected to a second row address line (RA1) 47, which carries a second row address selection signal. Transistor 37 is series-connected with transistors 36, 38. It will be appreciated by those skilled in the art that the arrangement of transistors 36, 37, 38 is interchangeable.

Figure 4:
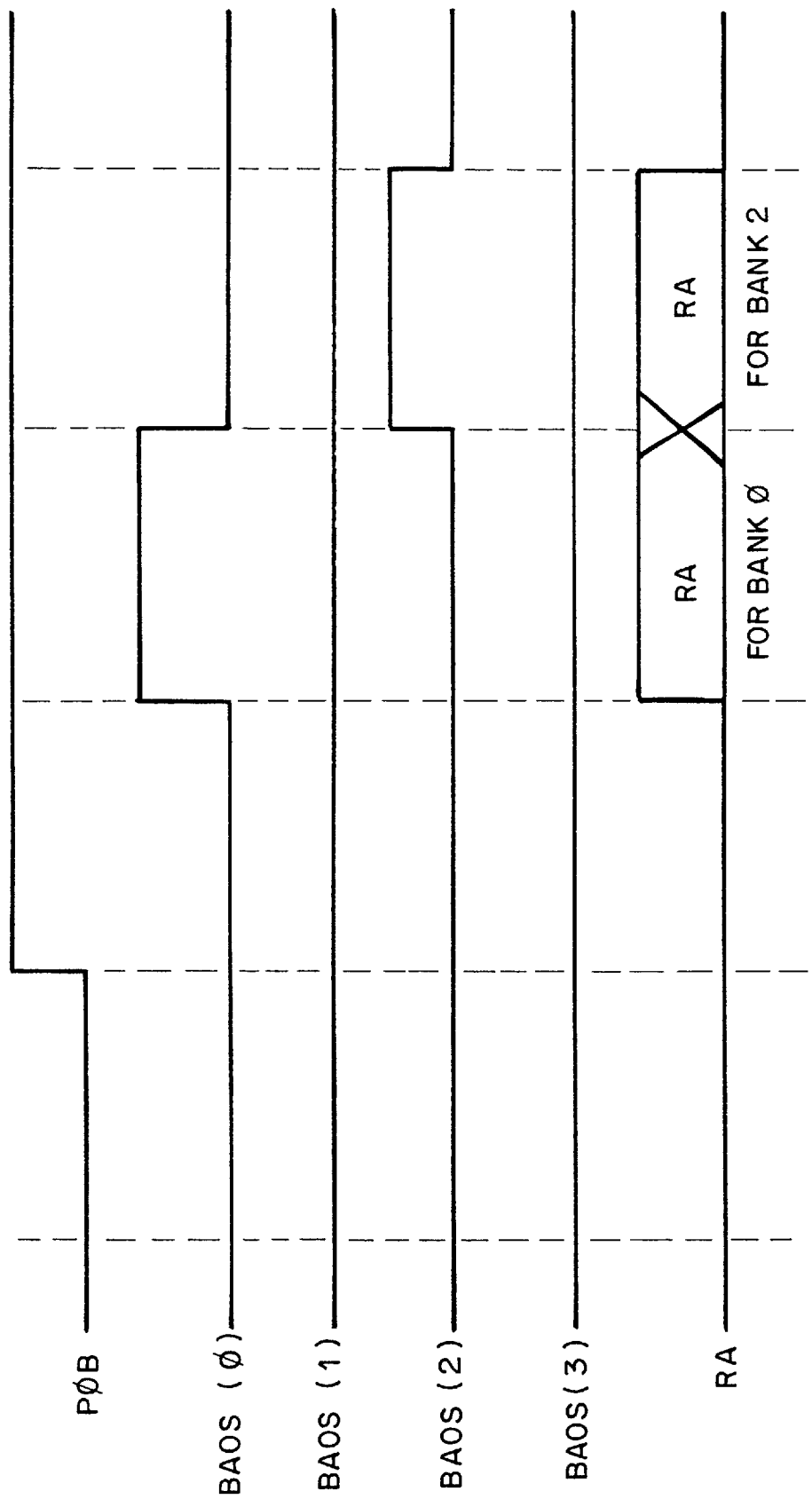
FIG. 4 is a timing diagram showing the timing scheme for certain signals on particular lines of the row predecoder circuit shown in FIG. 3.

In operation, and referring back to FIG. 3 and now also to FIG. 4, during a precharge cycle, the precharge clock signal (P0B) on precharge clock line 44 is LOW, which turns transistor 34 ON and drives the signal RAPB on the input terminal of inverter 42 HIGH. As a result, the signal RAP on enable line 32, located at the output of inverter 42, is LOW and the row decoder circuit 12 is disenabled. Inverter 40, which is a relatively weak feedback amplifier, latches these signals.

Upon completion of the precharge cycle, the precharge clock (P0B) signal on line 44 goes HIGH and shuts transistor 34 OFF. The bank active (BAOS) signal on bank active one shot line 48 goes HIGH when it is desired to perform a decoding function for the particular memory cell bank associated with the row predecoder circuit 30 and the row decoder circuit 12 shown in FIG. 3. It will be understood that any additional row predecoder circuits incorporated in the design will share the same bank active one shot line 48 for so long as they are associated with the same memory cell bank. It will further be appreciated that additional memory cell banks might be used in association with memory circuits that incorporate the technology of the present invention.

When the bank active (BAOS) signal on bank active one shot line 48 goes HIGH, it turns transistor 38 ON. If the row address (RA) signal on row address line 46 is LOW, transistor 36 is OFF and the RAPB signal on the input terminal of inverter 42 remains in its precharged and latched HIGH state, while the RAP signal on the enable line 32 remains in its precharged and latched LOW state. If, on the other hand, the row address (RA) signal on row address line 46 is HIGH, transistor 36 is turned ON and the RAPB signal on the input terminal of inverter 42 is pulled down to Vss potential (e.g., ground). The inverter 42 causes the RAP signal on enable line 32 to be driven HIGH and the inverter 40 latches these two states until the ensuing precharge cycle.

As described with reference to FIG. 3, a dynamic NAND gate is used together with feedback forming a latch. A one shot pulse (BAOS) is generated at the beginning of a bank active cycle that is bank specific (e.g., BAOS<0:3> for a four bank RAM). During this time, the NAND gate can detect and transfer through the valid row addresses (RA) and latch it on nodes RAPB and RAP. At the end of the active cycle, the precharge cycle clock (P0B) signal fires to reset the predecoder and prepare the circuit for the next active cycle.

Figure 2:
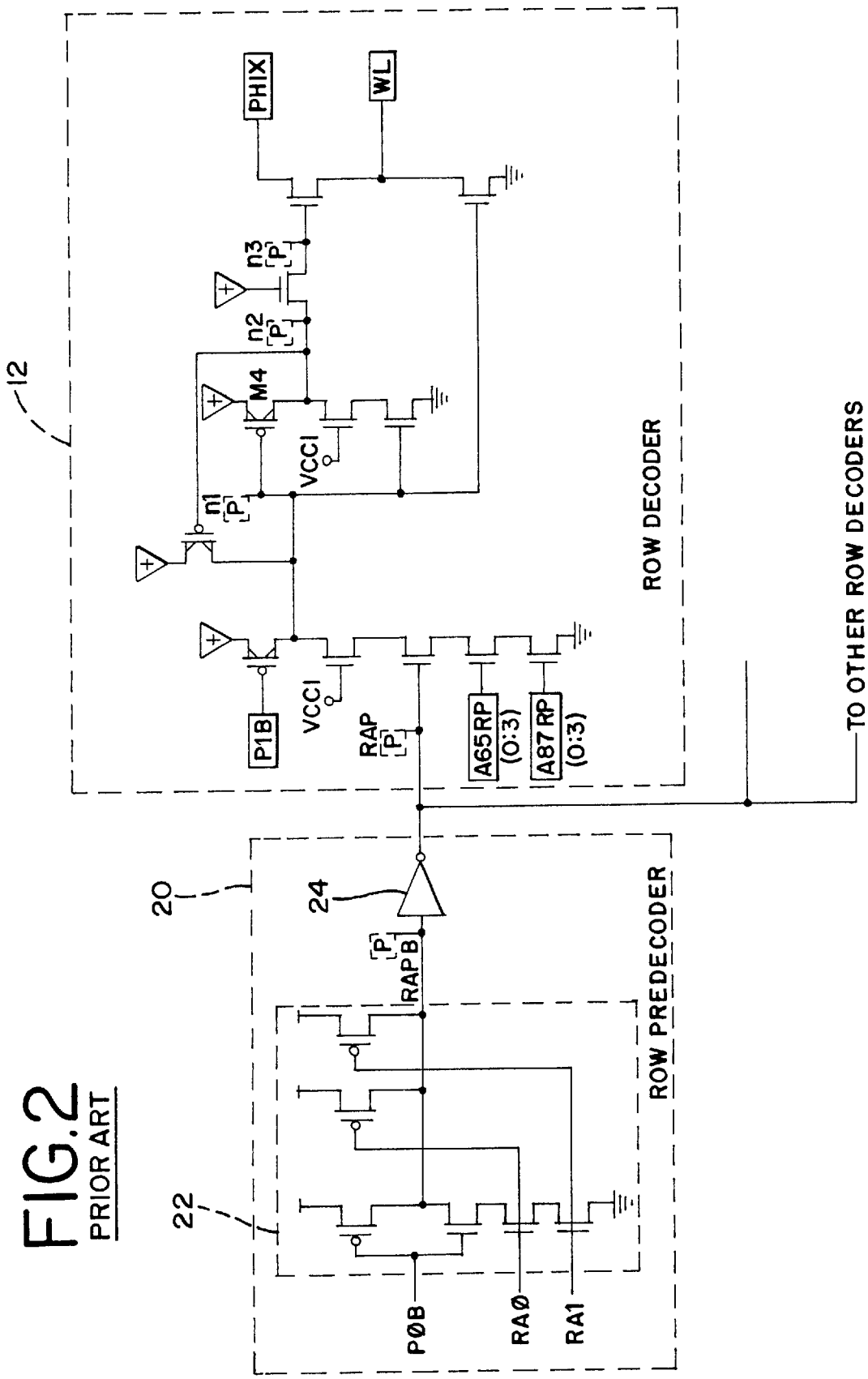
FIG. 2 is a circuit schematic diagram of other prior art row predecoder and row decoder circuits of the type conventionally used in memory circuits.

As will be appreciated, for the row predecoder circuit 30 shown in FIG. 3, the precharge clock (P0B) signal on precharge clock line 44 is LOW during each precharge cycle and HIGH during each decoding cycle. This is also the case for the prior art predecoder circuits shown in FIGS. 1 and 2, respectively. However, with respect to the embodiment of the predecoder circuit shown in FIG. 5, this is not the case.

Figure 5:
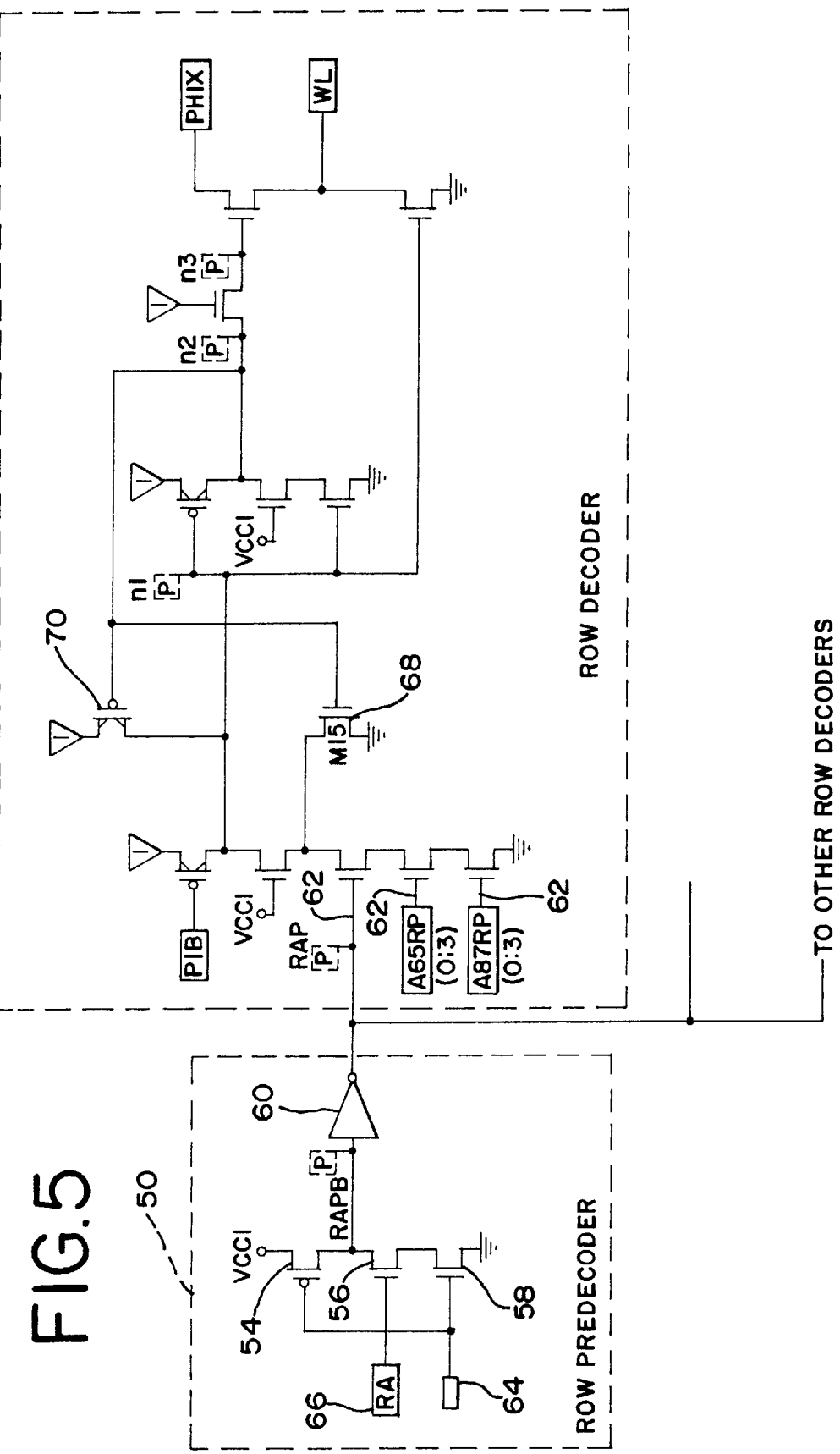
FIG. 5 is a circuit schematic diagram of a second embodiment of a row predecoder circuit and a row decoder circuit, both constructed in accordance with the principles of the present invention.

FIG. 5 illustrates a row predecoder circuit 50 and a row decoder circuit 52. Row predecoder circuit 50 includes three transistors 54, 56, 58, and an inverter 60. As shown, row predecoder circuit 50 is connected to row decoder circuit 52 by an enable line 62 and typically is connected to other row decoder circuits (not shown). As will be appreciated, additional row predecoder circuits (not shown) might be connected to row decoder circuit 52, specifically by enable lines 62 connected to the control electrodes for transistors included within the row decoder circuit 52.

In row predecoder circuit 50, for transistor 54, which is shown illustratively as a PMOS transistor device, one terminal is connected to Vcc, its control (gate) electrode is connected to a control line 64, which carries a control signal CNTRL, and another terminal is connected to the drain terminal of transistor 56 and the input terminal of inverter 60. For transistor 56, which is shown illustratively as an NMOS transistor device, its drain terminal is connected to a terminal of transistor 54 and the input terminal of inverter 60. The gate electrode of transistor 56 is connected to a row address line (RA) 66, which carries a row address selection signal. The source terminal of transistor 56 is connected to the drain terminal of transistor 58. For transistor 58, which is shown illustratively as an NMOS transistor device, its drain terminal is connected to the source terminal of transistor 56, its gate electrode is connected to control line 64, and its source terminal is connected to Vss (e.g., ground).

Figure 8:
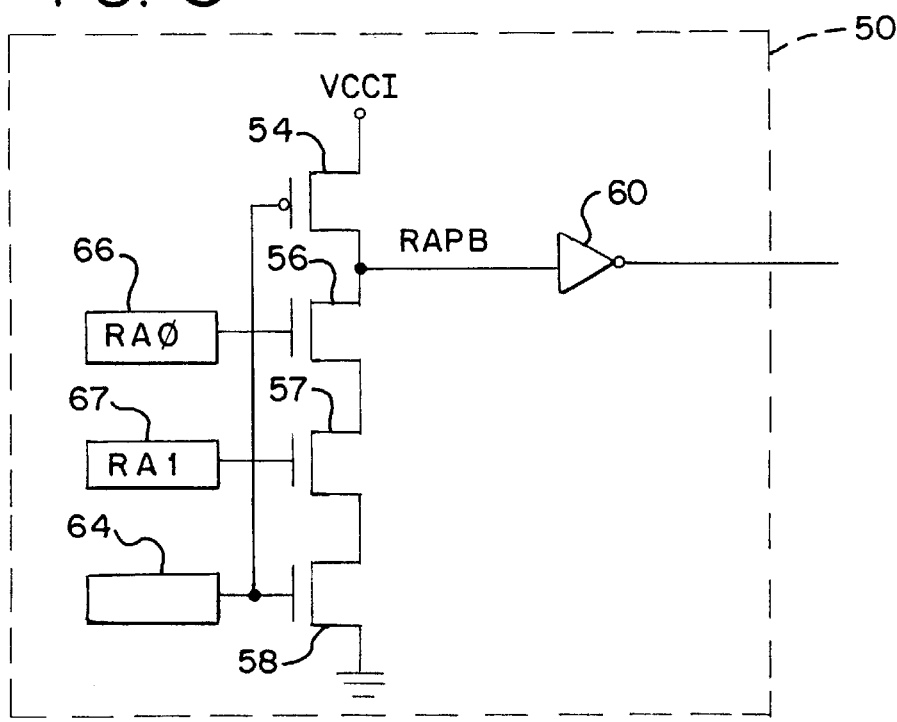
FIG. 8 is a circuit schematic diagram of an alternative embodiment of the predecoder circuitry shown in FIG. 5.

FIG. 8 illustrates the row predecoder circuit 50, but with multiple address inputs. Two address inputs are shown for illustrative purposes. For illustrative purposes, row address line 66 is identified as RA0 in the multiple address input embodiment shown in FIG. 8. As shown, additional transistor 57 is included, shown illustratively as an NMOS transistor device. The gate electrode of transistor 57 is connected to a second row address line (RA1) 67, which carries a second row address selection signal. Transistor 57 is series-connected with transistors 56, 58. It will be appreciated by those skilled in the art that the arrangement of transistors 56, 57, 58 is interchangeable.

Figure 6:
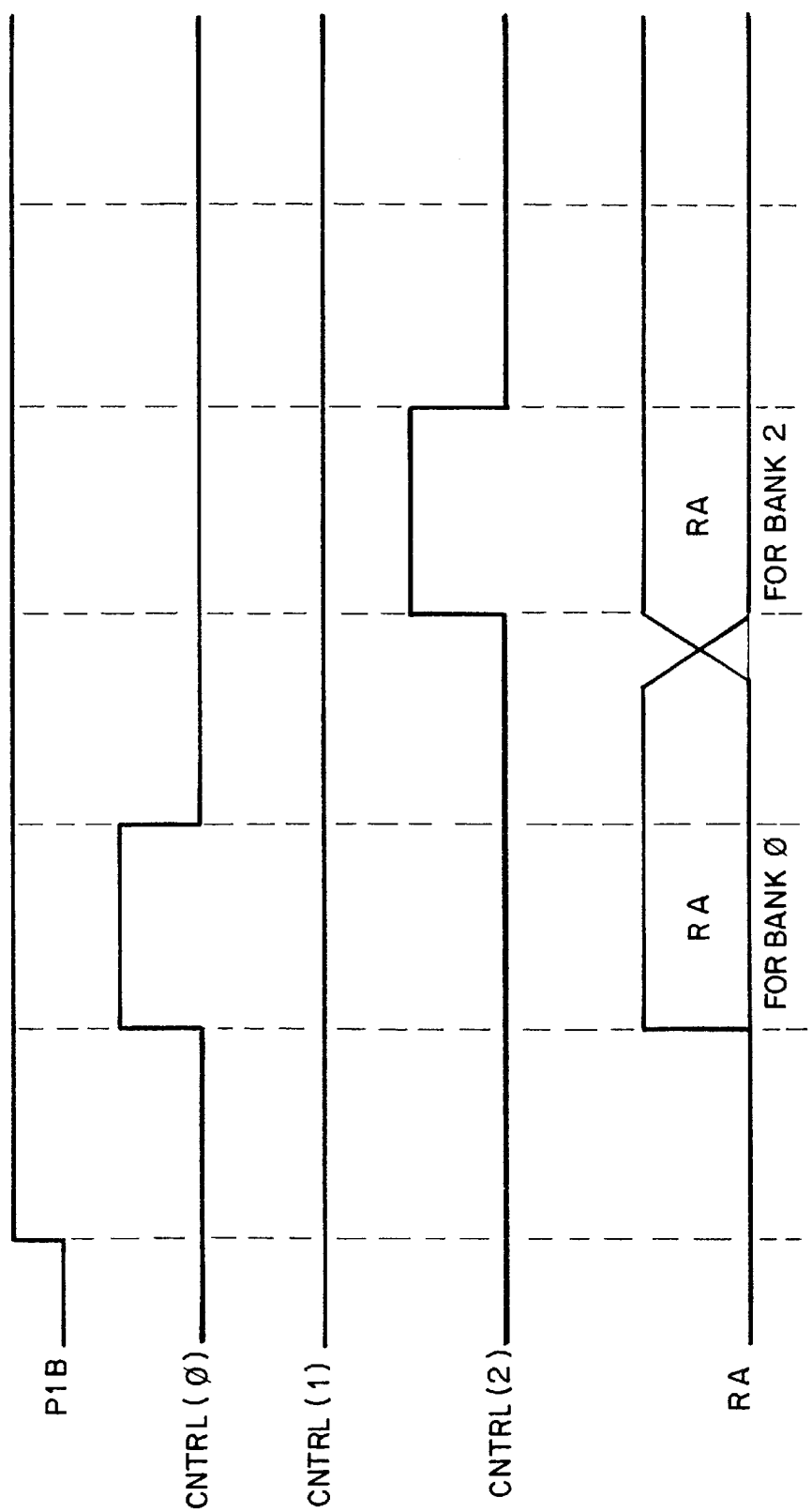
FIG. 6 is a timing diagram showing the timing scheme for certain signals on particular lines of the circuits shown in FIG. 5.

In operation, and referring back to FIG. 5 and now also to FIG. 6, during a precharge cycle, signal P1B in row decoder circuit 52 is LOW and the control signal on control line 64 is LOW, which turns transistor 54 ON and drives the signal RAPB on the input terminal of inverter 60 HIGH. As a result, the signal RAP on enable line 62, located at the output of inverter 60, is LOW and the row decoder circuit 52 is disenabled, absent special conditions described below.

Upon completion of the precharge cycle, signal P1B in row decoder circuit 52 is HIGH and the control signal on control line 64 goes HIGH and shuts transistor 34 OFF. In this embodiment, however, the control signal on control line 64 will go HIGH only during a decoding cycle and only for so long as the active bank is the memory cell bank associated with the predecoder circuit 50 and decoder circuit 52 shown in FIG. 5. In effect, the control signal on control line 64 is equivalent to the result of a logical "AND" operation for the bank active select (BAOS) and precharge clock cycle (P0B) signals of the circuit shown in FIG. 3. It will be understood that any additional row predecoder circuits incorporated in the design might share the same control line 64 for so long as they are associated with the same memory cell bank.

When the control signal on control line 64 goes HIGH, it shuts transistor 54 OFF and turns transistor 58 ON. If the row address selection (RA) signal on row address line 66 is LOW, transistor 56 is OFF. This causes the RAPB signal on the input terminal of inverter 60 and the RAP signal on the enable line 62 to float. If, on the other hand, the row address selection (RA) signal on row address line 66 is HIGH, transistor 56 is turned ON and the RAPB signal on the input terminal of inverter 60 is pulled down to Vss potential (e.g., ground). The inverter 60 causes the RAP signal on enable line 62 to be driven HIGH.

Once the bank associated with the circuitry shown in FIG. 5 is no longer selected, the control signal on control line 64 goes LOW again and the precharge cycle is resumed. This would result in disenablement of the row decoder circuit 52, if not for the additional transistor 68 that differentiates row decoder circuit 52 from the row decoder circuits 12 shown in FIGS. 1, 2 and 3, respectively. Transistor 68, as shown, latches a selected row decoder circuit and maintains its enabled stated. Transistor 70, on the other hand, latches an unselected row decoder circuit and maintains its disenabled state.

As described with reference to FIG. 5, it includes a control signal that is a one shot active HIGH signal that is edge-triggered on the beginning of a bank active cycle. The latch is moved to the first stage of the row decoder circuit.

Both circuits in FIGS. 3 and 5 use dynamic logic that is faster than the static logic used in the prior art. They also do not use full CMOS logic gates so chip area is saved. Further, they use a shared address bus, which also saves chip area.

While this invention has been described with reference to certain illustrative embodiments, it will be understood that this description shall not be construed in a limiting sense. Rather, various changes and modifications can be made to the illustrative embodiments without departing from the true spirit and scope of the invention.

What is claimed is:

1. A method of predecoding an address selection signal in a memory circuit, comprising the steps of:
   providing a predecoder circuit comprising a dynamic NAND gate having a first circuit element and a second circuit element;

providing an inverter gate electrically coupled to said dynamic NAND gate and having an output terminal electrically coupled to a plurality of row decoder circuits for the memory circuit;

selectively enabling said first circuit element with a first input signal comprising a self-timed one shot pulse signal indicative of an active memory bank for said memory circuit; and selectively enabling said second circuit element with a second input signal indicative of a selected memory row address for said active memory bank.

2. The method of claim 1 further comprising the steps of providing said predecoder circuit with a precharge circuit, generating a precharge control signal, and selectively enabling said precharge circuit with said precharge control signal.

3. The method of claim 2 wherein said precharge circuit is selectively enabled by said precharge control signal only during such periods of time in which said first circuit element is not enabled by said first input signal.

4. The method of claim 1 further comprising the steps of providing said predecoder circuit with a precharge circuit, and selectively enabling said precharge circuit with said first input signal.

5. The method of claim 4 wherein said precharge circuit is selectively enabled by said first input signal only during such periods of time in which said first circuit element is not enabled by said first input signal.

6. The method of claim 1 further comprising the step of selectively electrically coupling said inverter to one or more row decoder circuits provided for said memory circuit.

* * * * *